United States Patent [19]

Niki et al.

[11] Patent Number: 4,854,230
[45] Date of Patent: Aug. 8, 1989

[54] SCREEN PRINTING APPARATUS

[75] Inventors: Kenichi Niki; Tetsuro Makita; Hayato Takasago, all of Amagasaki, Japan

[73] Assignee: Mitsubishi Denki Kabushiki Kaisha, Tokyo, Japan

[21] Appl. No.: 193,222

[22] Filed: May 11, 1988

Related U.S. Application Data

[63] Continuation of Ser. No. 939,136, Dec. 8, 1986, abandoned.

[30] Foreign Application Priority Data

Dec. 24, 1985 [JP] Japan ............... 60-289397

[51] Int. Cl.⁴ .............. B41L 13/18; B05C 1/00
[52] U.S. Cl. ................... 101/123; 101/119
[58] Field of Search ........... 101/123, 366, 119, 120, 101/124; 118/213, 406

[56] References Cited

U.S. PATENT DOCUMENTS

| | | | |
|---|---|---|---|
| 1,413,995 | 4/1922 | Salerno | 101/123 |
| 1,785,732 | 12/1930 | Flockhart | 101/123 |
| 1,892,267 | 12/1932 | Flockhart | 101/123 |
| 2,027,102 | 1/1936 | Hommel et al. | 101/123 |
| 3,384,931 | 5/1968 | Cochran et al. | 101/123 |
| 3,613,635 | 10/1971 | Brehm | 101/119 X |
| 4,023,486 | 5/1977 | Linthicum et al. | 101/123 |

FOREIGN PATENT DOCUMENTS

80/2399 11/1980 PCT Int'l Appl. ............... 101/119

OTHER PUBLICATIONS

David F. Zarnow, "A New Approach to Thick Film Resistors", ISHM 1979 Proceedings, pp. 32–39.
F. L. Givens et al., *J. Electrochem. Soc.: Solid-State Science and Technology*, 126: 269–272 (1979).
Morris Shankin, "Write It, Don't Screen It!", ISHM 1978 Proceedings, pp. 18–25.

*Primary Examiner*—David A. Wiecking
*Assistant Examiner*—James Lisehora
*Attorney, Agent, or Firm*—Saidman, Sterne, Kessler & Goldstein

[57] ABSTRACT

A screen printing apparatus comprising a screen having an opening or openings of a desired print pattern and having a lower surface being positioned adjacent to a substrate to be printed, and a nonflexible squeegee comprising a cavity for containing a material to be printed on the substrate. The cavity is defined by the interior surfaces of surrounding walls extending generally vertically from the lower extremities at which the squeegee directly contacts the upper surface of the screen. While the squeegee travels with respect to the screen the material to be printed flows from the cavity into the openings of the screen, and thereby onto the substrate. The squeegee may be formed of stainless steel, a ceramic material or a synthetic resin.

12 Claims, 4 Drawing Sheets

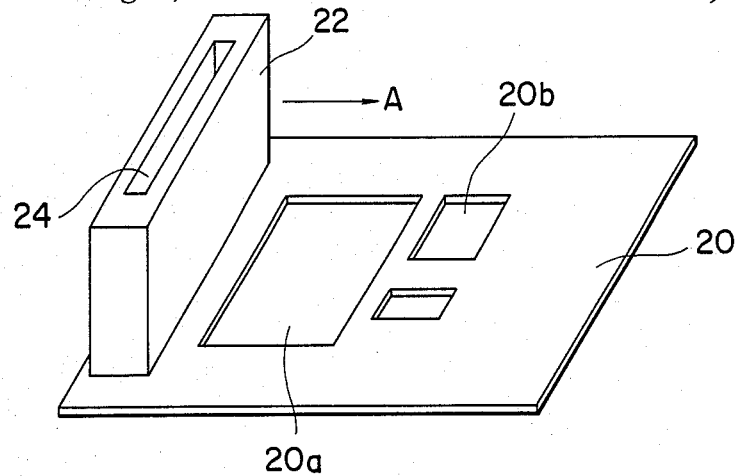
F I G. 3
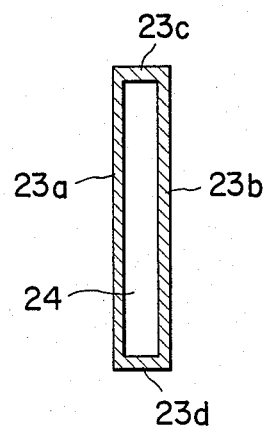
F I G. 4

SCREEN PRINTING APPARATUS

This application is a continuation of application Ser. No. 939,136, filed Dec. 8, 1986, now abandoned.

BACKGROUND OF THE INVENTION

The present invention relates to a screen printing apparatus, particularly one suitable for applying a low viscosity material to a large area of a substrate.

FIG. 1 shows, in cross section, a conventional screen printing apparatus for printing or applying a fluid material (hereinafter referred to as "ink") to be printed, such as solder paste, on a substrate. The printing apparatus comprises a screen 1 formed of a metal plate and having one or more openings 1a, a screen frame 2 and a mesh joining the screen 1 and the frame 2. A flexible squeegee 4 is formed of a urethane rubber or the like.

The squeegee 4 is moved in the direction of the arrow A, while its lower end is pressed against the screen. Fluid ink 5, such as solder paste, placed on the screen 1 is introduced into the openings 1a, in turn. When the screen frame 2 is moved away from a substrate table 7, the pattern of the opening 1a is printed on a substrate 6 of a material such as ceramics.

The above-described conventional printing apparatus has the following disadvantages. First, when a fluid ink 5 of viscosity of about 200P (poise) or less is used, as is common, the ink 5 escapes by the sides of the squeegee and is thus wasted. Secondly, the lower end of the resilient squeegee projects into the opening, so that uniformity in the printed film thickness cannot be obtained. The amount of this projection is larger as the area of each opening is larger, and in certain instances so large that the lower end of the squeegee touches the substrate, preventing proper printing.

SUMMARY OF THE INVENTION

An object of the invention is to provide a screen printing apparatus according to which waste of the ink can be minimized even where the ink has a low viscosity.

Another object of the invention is to provide a screen printing apparatus with which uniformity in the printed film thickness can be obtained regardless of the size of the openings.

According to the invention, there is provided a screen printing apparatus comprising a screen having an opening or openings of a desired print pattern and having a lower surface being positioned adjacent to a substrate on which printing is to be made, and a nonflexible squeegee having a cavity for containing a material to be printed on the substrate, the cavity being defined by surfaces of surrounding walls extending generally vertically and extending to a lower extremity of the squeegee to be adjacent to an upper surface of the screen, whereby while the squeegee is made to travel the material to be printed flows from the cavity into the openings of the screen, thereby onto the substrate.

With the above arrangement, the material to be printed, i. e., the ink, is retained in the cavity surrounded by the walls, and passes out of the cavity only by the opening in its lower end, into the openings of the screen. Thus, no escape of the ink occurs and the waste of ink is thereby minimized. Moreover, the squeegee is nonflexible, so that it is not deformed even when it is pressed against the screen. Therefore, the cavity is not deformed, and the ink, whose flow is not affected by the pressing of the squeegee, flows uniformly from the cavity into the openings. The printed film thickness is therefore invariant. Furthermore, the squeegee does not project by deformation into the openings, so that the printed film thickness is accurately regulated by the thickness of the screen. In addition, the squeegee can be smoothly moved since it is not deformed.

BRIEF DESCRIPTION OF THE DRAWINGS

In the accompanying drawings:

FIG. 3 is a perspective view showing the screen printing apparatus of FIG. 2;

FIG. 4 is a cross sectional view taken along the line IV—IV in FIG. 2;

DETAILED DESCRIPTION OF THE PREFERRED EMBODIMENTS

Figure 5:
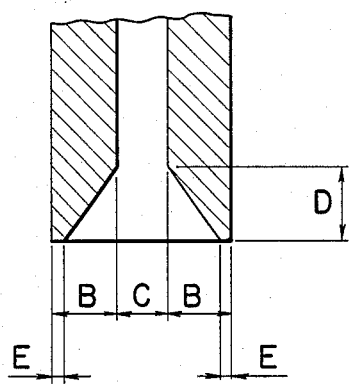
FIG. 5 is a sectional view, in an enlarged scale, of the lower part of the squeegee.

The embodiment of a screen printing apparatus according to the present invention comprises a screen 20 formed of a metal plate and having openings 20a, 20b penetrating the screen 20 to form a desired pattern. The printing apparatus further comprises a screen frame 2, a mesh 3 joining the frame 2 and the screen 20, and a substrate table 7 on which a substrate 6 of a material such as ceramics is mounted for printing. A squeegee 22 is formed of a nonflexible, i. e., rigid material, such as stainless steel, and is shown to be shaped to a rectangular parallelepiped (as seen from the outside). The squeegee 22 is provided with a cavity 24 for containing an ink 26. The cavity 24 is defined by surrounding walls 23a through 23d extending substantially vertically. The walls 23a through 23d are integrated to form the squeegee block 22. The walls 23a and 23b opposite to each other and perpendicular to the direction of the travel of the squeegee during printing (as indicated by arrow A) are relatively wider than the walls 23c and 23d connecting these wide walls 23a and 23b. Walls 23c and 23d are parallel to the direction of the travel of the squeegee 22 during printing. The wide walls 23a and 23b have their lower end parts 23e and 23f tapered toward their lower extremities 23g and 23h, while the outer surfaces are essentially vertical. As a result, the width of the cavity 24 in the direction of the travel of the squeegee 22 during printing is increased toward its lower extremity. Thus, the cavity 24 comprises an upper rectangular parallelepiped part 24a and a lower part 24b having a trapezoidal cross section; these parts 24a and 24b are contiguous with each other. Typical dimensions B, C, D and E (FIG. 5) of the lower end part of the squeegee are as follows; B=2.5 mm; C=5 mm; D=5 mm; E=0.5 mm. The cavity extends to cover the entire width of the screen, i. e., is as wide as the screen measured and normal to the direction of travel of the squeegee.

The upper extremity of the cavity 24 is shown open. Alternatively, it may be sealed so that a pressure can be applied to the cavity 22, if needed depending on the amount of the ink 26 in the cavity, and in consideration of the viscosity of the ink, to force the ink from the cavity to the openings in the screen.

The ink 26 may be solder paste, photoresist, epoxy resin, polymid resin or other materials which are capable of flowing.

To conduct printing, a substrate 6 on which printing is desired is placed on the substrate table 7, and is covered by the screen 20 with openings of the desired printing pattern. A squeegee 22 with its cavity filled with the ink 26 to be printed is made to travel in the direction of the arrow A, i. e., parallel to the surface of the screen 22, with the lower end of the squeegee 22 being in contact, at a predetermined pressure, with the screen 20. When the squeegee 22, particularly the lower extremity of the cavity 24, passes each of the openings 20a, 20b in the screen 20, the ink 26 flows out of the cavity 24 into the openings, so that the openings are filled with the ink 26. After the squeegee 24 has passed all the openings, either the screen frame 2 or the substrate table 7 is moved so that they are separated from each other, and hence the screen 20 and the substrate 6 are separated from each other. Printed films of ink having a pattern corresponding to the pattern of the openings are left on the substrate 6. The printed films are of a uniform thickness. The thickness of the printed film can be adjusted to a desired value by properly selecting the thickness of the screen and the speed of the travel of the squeegee.

Figure 6:
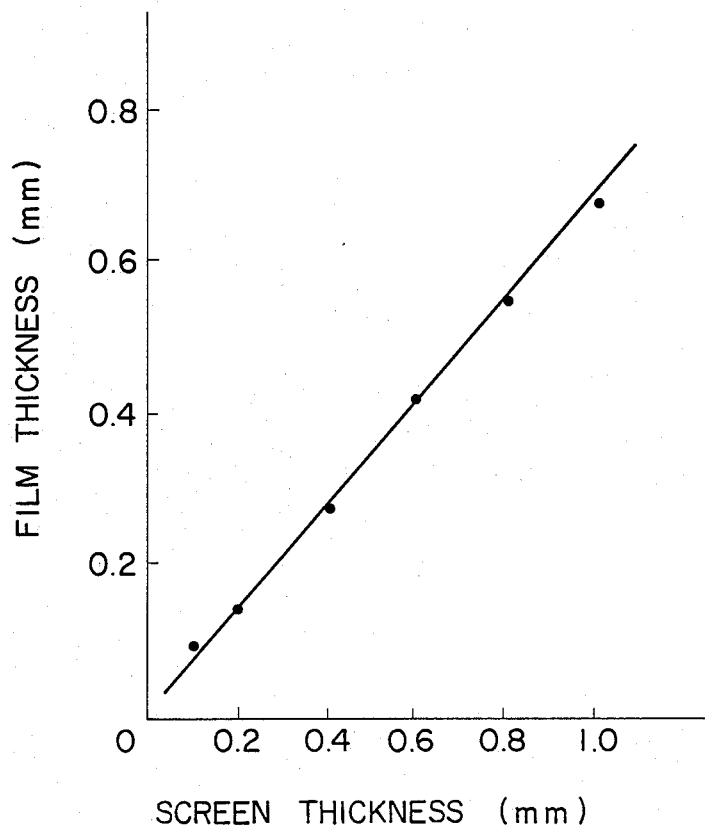
FIG. 6 is a diagram showing a relationship between the thickness of the screen and the thickness of the printed film.

The relationship between the thickness of the printed film and the thickness of the screen is shown in FIG. 6. As is seen, there is a correlation between them, so that the thickness of the printed film can be controlled by changing the thickness of the screen.

The screen thickness may be within the range of 30 micrometers to 1 mm. It is difficult, in practice, to produce a screen less than 30 micrometers thick; furthermore, a screen of less than 30 micrometers is easily damaged during the travel of the squeegee. Moreover, the squeegee may engage the substrate and damage the surface of the substrate. With a screen thicker than 1 mm, the ink on the substrate may tend to flow out of the desired pattern area when the screen is separated from the substrate.

It is also possible to change the thickness of the printed film by varying the travel speed of the squeegee. That is, although the thickness of the printed film is determined principally by the thickness of the screen, it is possible to produce a printed film thickness smaller than the screen thickness, by setting the squeegee travel speed higher relative to the ink flow rate from the cavity to the openings. As the ink flow rate is dependent on its viscosity, and on the resistance of the path of the ink flow (including in particular the shape of the cavity and the walls), the printed film becomes thinner with higher squeegee travel speeds.

It is also possible to change, in combination, both of the screen thickness and the squeegee travel speed, to obtain the desired printed film thickness.

Figure 1:
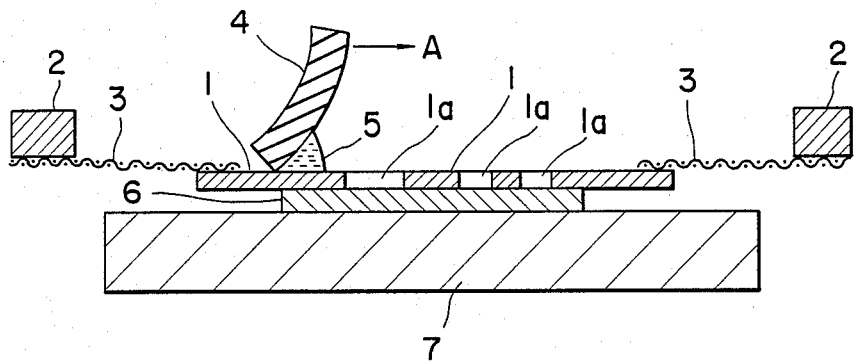
FIG. 1 is a sectional view showing a conventional screen printing apparatus.
Figure 2:
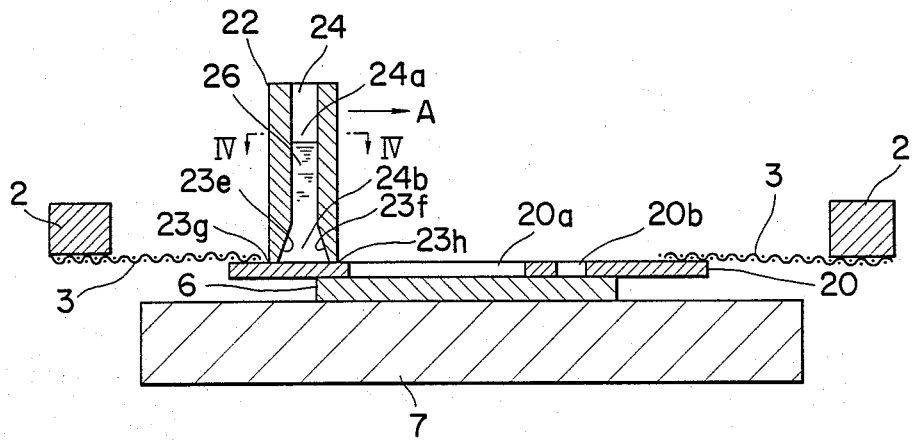
FIG. 2 is a sectional view showing a screen printing apparatus of an embodiment of the invention.
Figure 7:
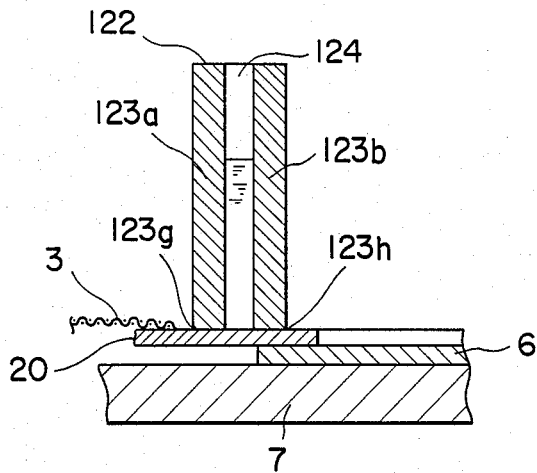
FIG. 7 is a sectional view showing a modification of the squeegee.

FIG. 7 shows a modification of the squeegee 122, in which the squeegee walls 123a and 123b are not tapered but are of uniform thickness down to their lower extremities 123g and 123h. The squeegee of FIG. 7 shares the merits with that squeegee of FIG. 2 that waste of the ink is minimized and the projection of the squeegee into the openings of the screen is avoided. However, the embodiment of FIG. 2 is more advantageous in that a better uniformity in the printed film thickness is obtained. This will be explained below.

With the squeegee of FIG. 2, the flow of the ink is facilitated by the increased dimension of the cavity toward its lower extremity. Moreover, because the lower end parts of the walls are tapered, the lower extremities are thinnest. With the thin lower extremities, the effect of the fluid shear to which the viscous ink is subject when the ink is discharged through the lower extremities is reduced. If the lower extremities of the walls were thicker, as in the squeegee of FIG. 7, the shear would be larger and the greater disorder in the ink discharge tends to occur, which can cause fluctuation in the thickness of the film.

The thin lower extremities of the walls of the cavity cooperate with the inclined surfaces, increasing the dimension of the cavity toward its lower extremity, to facilitate the flow of the ink, thereby to achieve a better uniformity of the printed film thickness.

Figure 8:
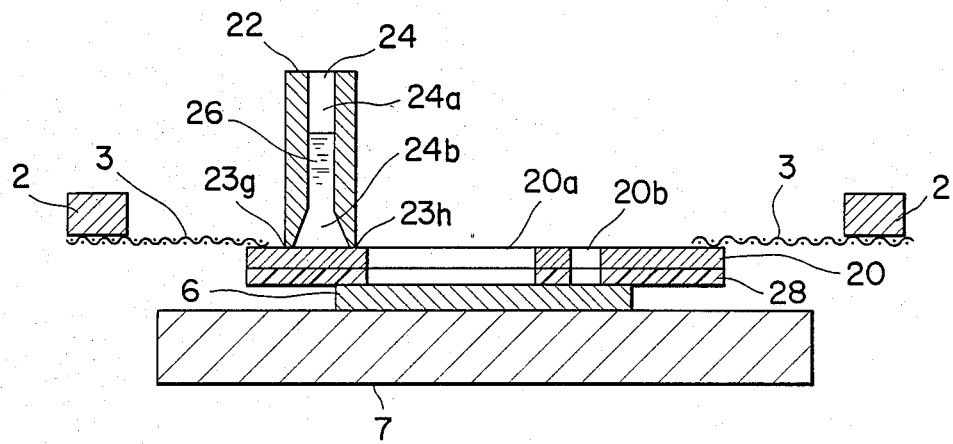
FIG. 8 is a sectional view showing a modification of the screen.

FIG. 8 shows another embodiment of the invention, in which the lower surface of the screen 20 is covered with a synthetic resin 28. The synthetic resin 28 is preferably of the JIS(A) hardness of 10 to 150 and of the thickness of 10 to 500 micrometers.

If the screen 20 is covered with the synthetic resin 28, blotting of the pattern is reduced, printing of a more minute pattern is enabled, and the number of continuously repeated printing steps can be increased.

In the embodiments described, the squeegee 22 is formed of metal, such as stainless steel The squeegee may alternatively be formed of a hard inorganic material, such as ceramics having a superior wear resistance, or of a synthetic resin having a Vickers hardness of 10 or more.

The shape of the squeegee is not limited to the rectangular parallelepiped, but can be modified to suit the particular application.

In the embodiment described, the squeegee is made to travel in one direction for printing. But the squeegee may be reciprocated for printing; ink can be moved from the cavity to the screen openings during travel in both directions.

Use of a squeegee, of which at least the lower part is symmetrical with respect to a plane perpendicular to the direction of the travel is advantageous if the printing is conducted during the travel in both directions. In this way printing in both directions is conducted under the same conditions. Therefore, substrates on which printing is made by travel in one direction and substrates on which printing is made by travel in the other direction will be subject to the same printing conditions and hence will have the same printed film thickness if other conditions are unchanged.

In the embodiment described, the screen 20 is formed of a plate of metal, such as stainless steel. But, screens formed of other materials may alternatively be used.

As has been described, according to the invention, the squeegee is nonflexible and comprises a cavity to contain the ink, from which it is supplied to the openings of the screen while the squeegee travels with its lower extremity being in contact with the screen. Accordingly, escape and waste of the ink are minimized and the ink utilization is almost 100 percent. The squeezee does not project into the openings, so that uniformity in the film thickness is improved. The film thickness can therefore be controlled accurately.

What is claimed is:

1. A screen printing apparatus comprising a substantially flat screen having at least one opening forming a desired print pattern and having a lower surface being positioned adjacent to a substrate to be printed, wherein the screen is fixed relative to the substrate, and a non flexible squeegee having a cavity formed therein for containing a liquid material to be printed on the substrate, the cavity being defined by surfaces of surrounding nonflexible walls extending generally vertically and extending to a lower extremity of the squeegee, said nonflexible walls being in direct contact with an upper surface of the screen, whereby while the squeegee travels with respect to the screen and the substrate, the material to be printed flows from the cavity into the at least one opening of the screen, and thereby onto the substrate.

2. An apparatus according to claim 1, wherein the walls defining said cavity comprise a first pair of relatively wide walls parallel to each other and extending normal to the direction of travel of the squeegee, and a second pair of relatively narrow walls joining the sides of and extending normal to the first pair of walls.

3. An apparatus according to claim 2, wherein lower end portions of the first pair of walls are tapered.

4. An apparatus according to claim 3, wherein the width of the cavity in the direction of the travel of the squeegee is increased toward the lower extremity of the cavity.

5. An apparatus according to claim 2, wherein the width of the cavity in the direction of travel of the squeegee is increased toward the lower extremity of the cavity.

6. An apparatus according to claim 1, wherein the cavity extends across the entire width of the screen in the direction parallel to the surface of the screen and normal to the direction of travel of the squeegee.

7. An apparatus according to claim 1, wherein the shape of the squeegee is symmetrical with respect to a plane normal to the direction of travel of the squeegee.

8. An apparatus according to claim 1, wherein the squeegee is formed of stainless steel, ceramics or a rigid synthetic resin.

9. An apparatus according to claim 1, wherein the screen has a thickness within a range of 30 micrometers to 1 mm.

10. An apparatus according to claim 1, further comprising a support means on which the substrate is placed.

11. A screen printing apparatus comprising a screen having at least one opening forming a desired print pattern and having a lower surface being positioned adjacent to a substrate to be printed, a film of synthetic resin covering the screen, the film of synthetic resin being of a thickness within a range of 10 to 50 micrometers and having a JIS(A) hardness within a range of 10 to 150, and a non flexible squeegee having a cavity formed therein for containing a material to be printed on the substrate, the cavity being defined by surfaces of surrounding nonflexible walls extending generally vertically and extending to a lower extremity of the squeegee, said nonflexible walls being in direct contact with an upper surface of the screen, whereby while the squeegee travels with respect to the screen and the substrate, the material to be printed flows from the cavity into the at least one opening of the screen, and thereby onto the substrate.

12. A screen printing apparatus comprising a substantially flat screen having at least one opening forming a desired print pattern and having a lower surface being positioned adjacent to a substrate to be printed, wherein the screen is fixed relative to the substrate, and a non flexible squeegee having a cavity formed therein for containing a liquid material to be printed on the substrate, the cavity being defined by interior surfaces of surrounding nonflexible walls extending to a lower extremity of the squeegee, said nonflexible walls being in direct contact with an upper surface of the screen, wherein the interior surfaces of the surrounding nonflexible walls define the cavity so as to comprises an upper rectangular parallelepiped part and a lower part having a cross section of an outwardly inclined trapezoid continuous with each other, wherein said surrounding nonflexible walls comprise generally vertical exterior surfaces which extend the lower extremity of the squeegee, whereby while the squeegee travels with respect to the screen and the substrate, the material to be printed flows from the cavity into the at least one opening of the screen, and thereby onto the substrate.

* * * * *